(12) United States Patent
Kawaguchi (10) Patent No.: US 6,703,699 B2
(45) Date of Patent: Mar. 9, 2004

(54) SEMICONDUCTOR DEVICE (75) Inventor: Muneyoshi Kawaguchi, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 11 days.

(21) Appl. No.: 10/212,686

(22) Filed: Aug. 7, 2002

(65) Prior Publication Data

US 2003/0151128 A1 Aug. 14, 2003

(30) Foreign Application Priority Data

Feb. 14, 2002 (JP) ........................................ 2002-036457

(51) Int. Cl.[7] ............................................. H01L 23/02
(52) U.S. Cl. ....................................... 257/678; 257/700
(58) Field of Search ................................ 257/678, 700, 257/716–717

(56) References Cited

FOREIGN PATENT DOCUMENTS

JP          10-32308       2/1998

Primary Examiner—John B. Vigushin
Assistant Examiner—Luan Thai
(74) Attorney, Agent, or Firm—Oblon, Spivak, McClelland, Maier & Neustadt, P.C.

(57) ABSTRACT

The present invention has an object to provide a more compact semiconductor device that can be assembled with reduced parts and tasks. The semiconductor device includes a housing having a top and bottom surfaces. Surrounded within the housing is an insulating substrate with metal layers formed on both sides thereof. Also a semiconductor chip is mounted on one of the metal layer of the insulating substrate. A terminal connector extends along the top surface of the housing and is bent towards the bottom surface thereof for supplying power to the semiconductor chip. The housing has a housing through-hole extending from the top surface to the bottom surface through the housing, and the terminal connector has a terminal through-hole which are aligned with and formed coaxially with the housing through-hole.

6 Claims, 7 Drawing Sheets

SEMICONDUCTOR DEVICE

CROSS-REFERENCE TO RELATED APPLICATIONS

A related patent application is a commonly assigned Japanese Patent Application No. 2002-36457 filed on Feb. 14, 2002, which is incorporated by reference into the present patent application.

BACKGROUND OF THE INVENTION

1) Technical Field of the Invention

The present invention relates to a power semiconductor device for controlling a substantial amount of current used for electrical systems such as a motor and a heater.

2) Description of Related Arts

Recent industrial systems incorporated in an electric car and an elevator, in particular, have been improved in smooth motion and comfort for ride. This improvement comes significantly from contribution of power semiconductor devices that control the power (current) of such systems. In the power semiconductor devices, a substantial amount of heat is generated, which should efficiently be radiated outside of the power semiconductor device, for example, by using a radiating fin.

Figure 8:
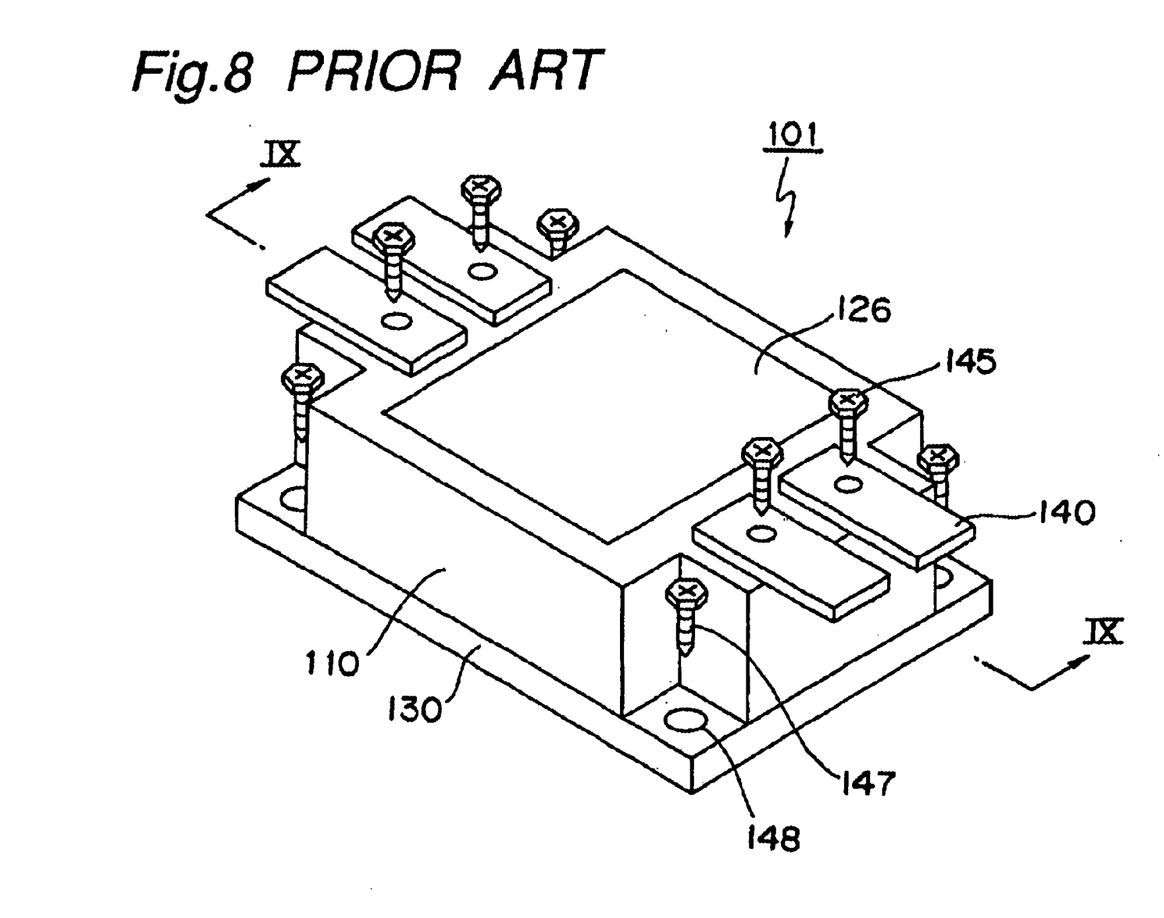
FIG. 8 is a schematic perspective view of a power semiconductor device according to the prior art.
Figure 9:
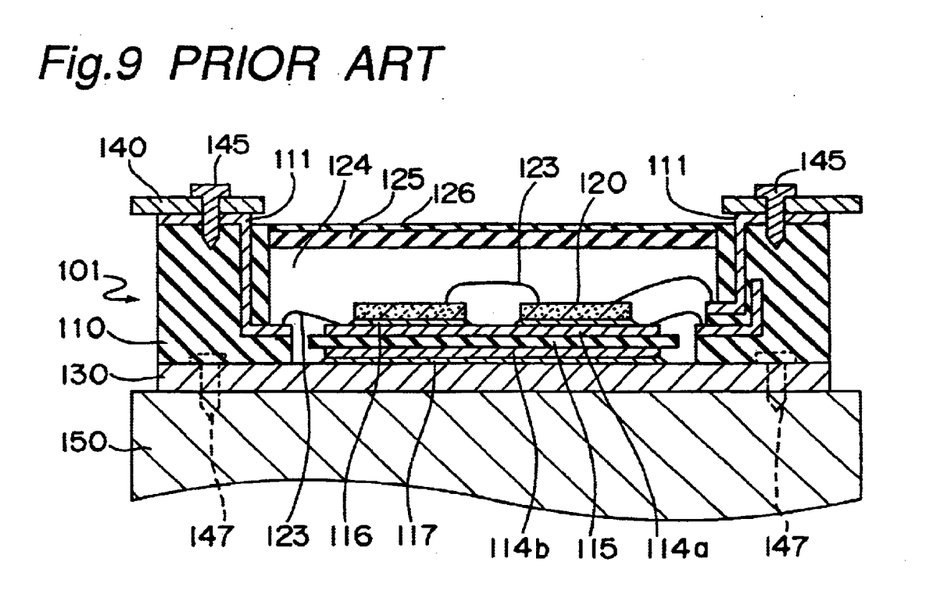
FIG. 9 is a cross sectional view taken along a line IX—IX in FIG. 8, illustrating the power semiconductor device of the prior art after assembled with the bus bars and the radiating fin.
Figure 10:
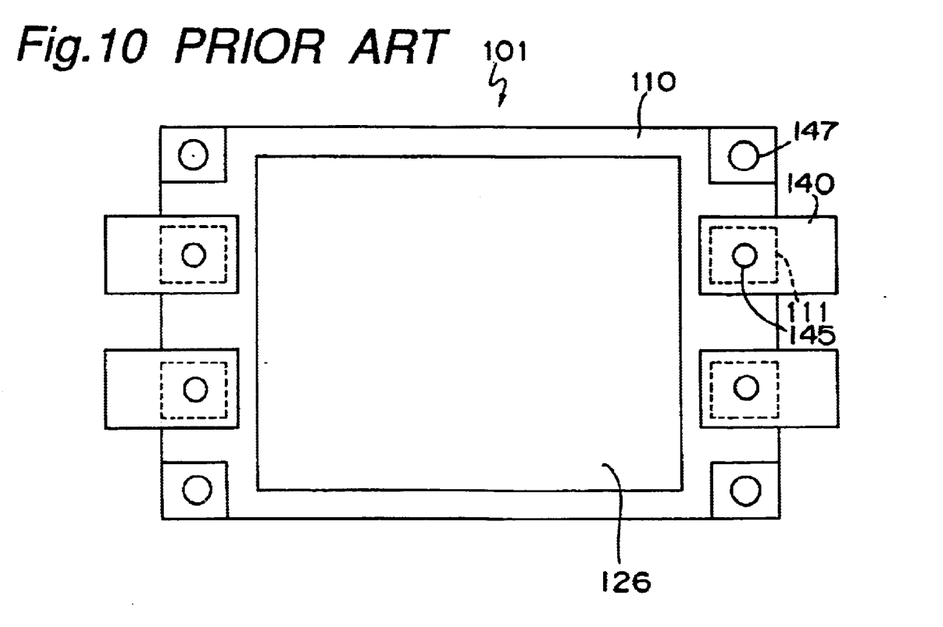
FIG. 10 is a top view of the power semiconductor device of the prior art after assembled with the bus bars and the radiating fin.

Referring to FIGS. 8 through 10, a conventional power semiconductor device will be described hereinafter. A power semiconductor device 101 shown in FIG. 8 includes, in general, a housing 110 made of insulating material such as resin and a base plate 130 made of metal of a good thermal conductivity such as copper. The housing 110 has a bottom surface fixed on the base plate 130 by means of metal screws or adhesive (not shown). As shown in FIG. 9, the power semiconductor device 101 also includes a plurality of main terminals 111 extending from an upper surface to an inside portion of the housing 110. The device 101 also includes an insulating substrate 115 with patterned metal layers 114a, 114b formed on both sides thereof, and a power semiconductor chip 120 mounted on the upper metal layer 114a by means of solder 116. The power semiconductor chip 120 is supplied with electric power from the main terminals 111 through a plurality of metal wires 123 of metal such as aluminum. The lower metal layer 114b of the insulating substrate 115 is bonded on the base plate 130 through a solder 117.

In the power semiconductor device 101, for protection of the semiconductor chip 120, silicone gel 124 (the hatching thereof not shown for clarity) is filled over the semiconductor chip 120 and the insulating substrate 115. The silicone gel 124 is then sealed by epoxy resin 125 deposited thereon. Lastly, a cover 126 is formed on the epoxy resin 125.

When the power semiconductor device 101 so constructed is assembled within a peripheral device, a plurality of bus bars 140, each of which is an external conducting plate (also referred to as "conducting member"), are arranged on and connected with the main terminals by means of metal screws 145, as shown in FIG. 9. Also, in the power semiconductor device 101, in order to efficiently radiate undesirable heat generated by the semiconductor chip 120 outside of the power semiconductor device 101, the base plate 130 is required to closely contact with a radiating fin 150 by means of a plurality of metal screws 147, as illustrated by imaginary lines of FIG. 9. Therefore, according to the power semiconductor device 101, the base plate 130 needs four through-holes 148 formed at each corner thereof for receiving metal screws 147 so as to closely contact with the radiating fin 150.

However, when the metal screws 147 are used to secure the base plate 130 on the radiating fin 150, the housing 110 can not be extended beyond the space over the through-holes 148 of the base plate 130. Thus, unavailable dead spaces are defined over the through-holes 148, thereby preventing the power semiconductor device 101 from downsizing. As clearly illustrated in FIG. 8, in the actual assembly of the power semiconductor device 101 to the peripheral device, four screws 145 are required to connect two pairs of bus bars 140 with the corresponding main terminals 111. And as above, another four screws 147 are essential to closely contact the base plate 130 with the radiating fin 150. It is almost impossible to reduce the number of parts (screws) and tasks required for assembly.

SUMMARY OF THE INVENTION

The present invention has an object to provide a more compact power semiconductor device, in which the base plate and the radiating fin can be secured without defining any dead space.

Also, the present invention has another object to provide the power semiconductor device that can be assembled with reduced parts and tasks, in which close contact between the base plate and the radiating fin can be achieved simultaneously with connection between the bus bars and the main terminals.

Further, the present invention has another object to provide the power semiconductor device, which eliminates the base plate.

In particular, the present invention is to provide a semiconductor device, which includes a housing having a top and bottom surfaces, and an insulating substrate with metal layers formed on both sides thereof. The insulating substrate is surrounded within the housing. A semiconductor chip is mounted on one of the metal layer of the insulating substrate. Also, a terminal connector extends along the top surface of the housing and is bent towards the bottom surface thereof for supplying the semiconductor chip with power. In the semiconductor device, the housing has a housing through-hole extending from the top surface to the bottom surface through the housing, and also the terminal connector has a terminal through-hole which are aligned with and formed coaxially with the housing through-hole.

Therefore, a fastening member (screw) extending through the housing through-hole and the terminal through-hole can be used to fasten the semiconductor device with a metal radiator, and at the same time, to realize an electrical connection between a conducting member and a terminal connector. Thus, total time required for assembly with peripheral devices and for connection between the conducting member and the terminal connector can substantially be reduced. Also, the undesirable dead spaces of the prior art are eliminated and number of parts is reduced so that the power semiconductor device of the present invention is more compact, simpler in structure, and less expensive to manufacture than the conventional power semiconductor device.

Further scope of applicability of the present invention will become apparent from the detailed description given hereinafter. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention more fully be understood from the detailed description given hereinafter and accompanying drawings which are given by way of illustration only, and thus are not limitative of the present invention and wherein.

DETAILED DESCRIPTION OF THE PREFERRED EMBODIMENTS

Referring to the attached drawings, the details of embodiments according to the present invention will be described hereinafter. In those descriptions, although the terminology indicating the directions (for example, "upper", "lower", and "vertical") are conveniently used just for clarity, it should not be interpreted that those terminology limit the scope of the present invention.

Embodiment 1

Figure 1:
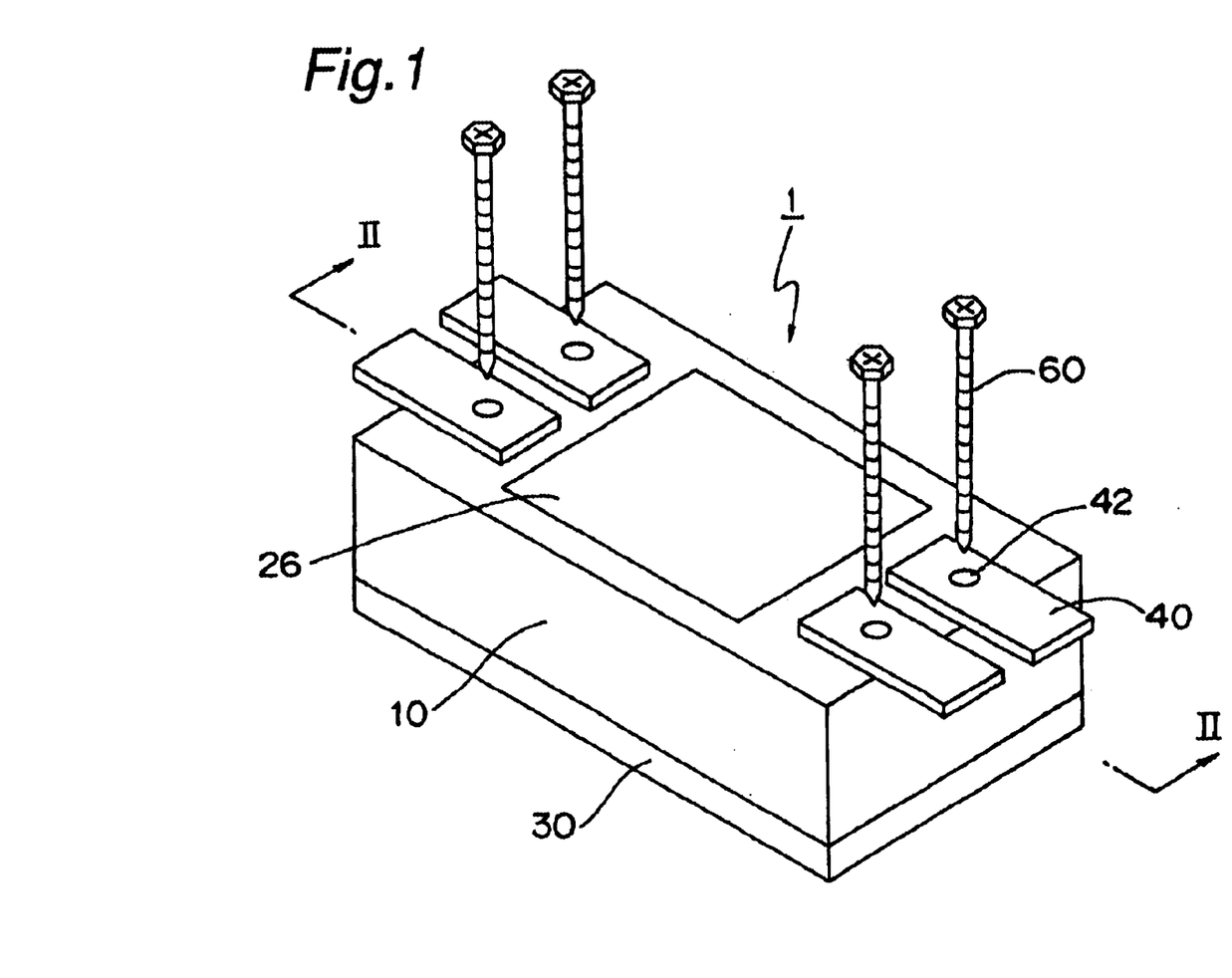
FIG. 1 is a schematic perspective view of a power semiconductor device according to Embodiment 1 of the present invention.
Figure 2:
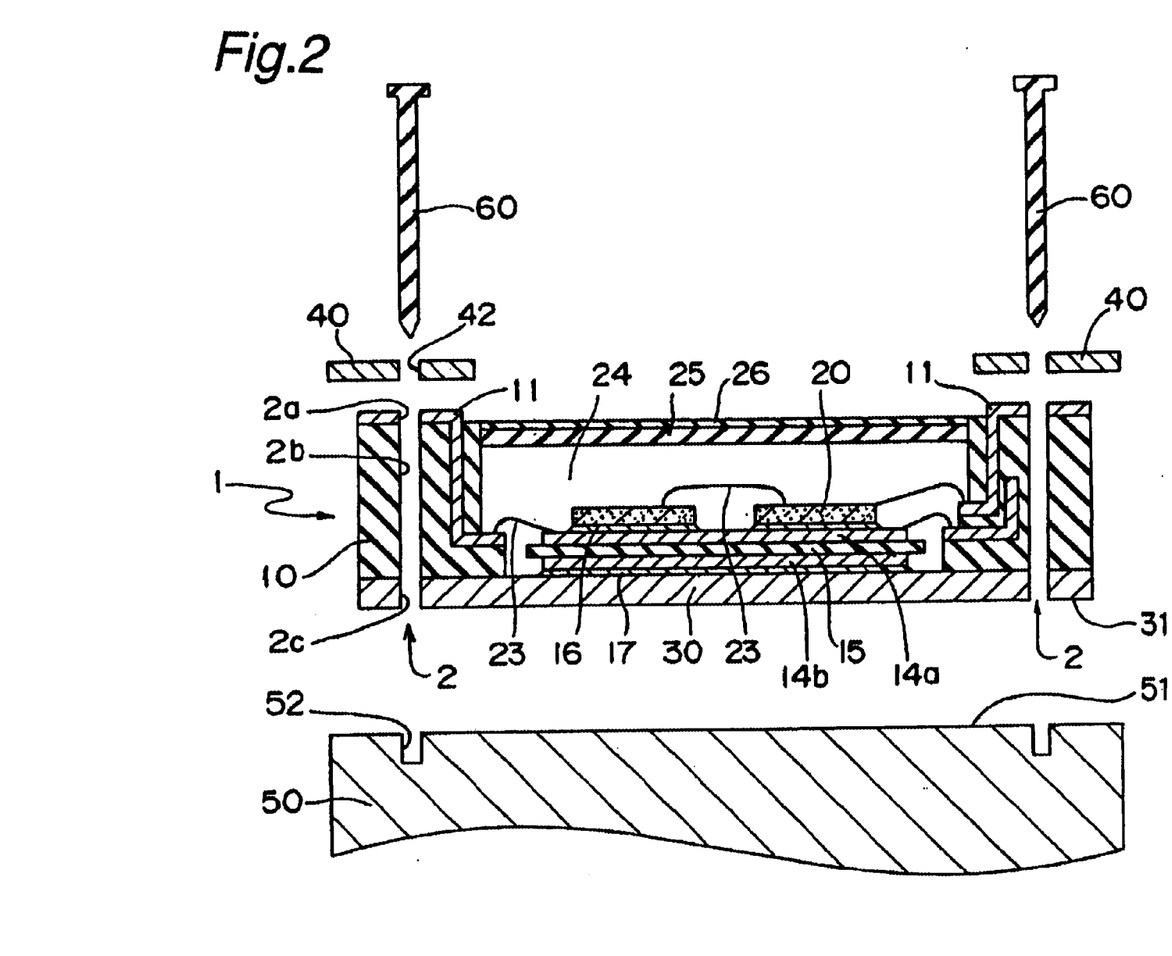
FIG. 2 is a cross sectional view taken along a line II—II in FIG. 1, illustrating the power semiconductor device before assembled with the bus bars and the radiating fin.

Referring now to FIGS. 1 through 4, a power semiconductor device according to Embodiment 1 of the present invention will be described hereinafter. A power semiconductor device 1 shown in FIG. 1 includes, in general, a housing 10 made of insulating material such as resin and a base plate 30 made of metal of a good thermal conductivity such as copper, which is also referred to as a supporting metal plate. The housing 10 has a bottom surface fixed on the base plate 30 by means of metal screws or adhesive (not shown). As shown in FIG. 2, the power semiconductor device 1 also includes a plurality of main terminals (also referred to as "terminal connectors") 11. Each of the main terminals 11 extends along and from an upper surface of the housing 10 and is bent towards the bottom surface thereof. The power semiconductor device 1 further has an insulating substrate 15 with patterned metal layers 14a, 14b formed on both sides thereof, and a power semiconductor chip 20 mounted on the upper metal layer 14a by means of solder 16. The power semiconductor chip 20 is supplied with an electric power from the main terminals 11 through a plurality of metal wires 23 made of metal such as aluminum. The lower metal layer 14b of the insulating substrate 15 is bonded on the base plate 30 through a solder 17.

In the power semiconductor device 1, for protection of the semiconductor chip 20, silicone gel 24 (the hatching thereof not shown for clarity) is filled over the semiconductor chip 20 and the insulating substrate 15. The silicone gel 24 is then sealed by epoxy resin 25 deposited thereon. Lastly, a cover 26 is formed on the epoxy resin 25.

According to the power semiconductor device 1 of the present invention, each of main terminals 11 has a terminal through-hole 2a extending in a vertical direction. Also, the housing 10 and base plate 30 have a housing through-hole 2b and a base-plate through-hole 2c, respectively, which are aligned with and formed coaxially with the terminal through-hole 2a extending in the vertical direction. Therefore, the power semiconductor device 1 of the present invention, as a whole, has a through-hole 2 defined by the terminal through-hole 2a of the main terminal 11, the housing through-hole 2b of the housing 10, and the base-plate through-hole 2c of the base plate 30.

Figure 3:
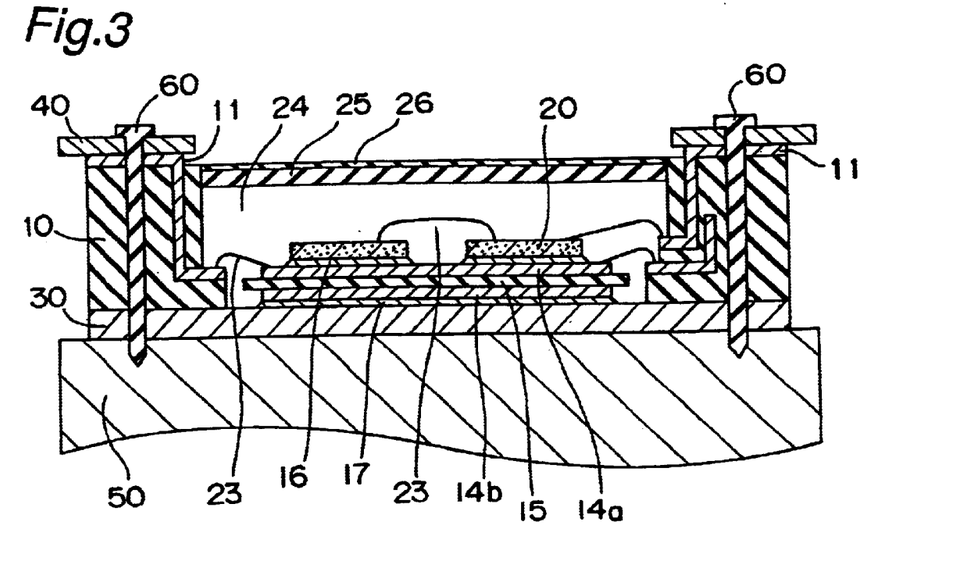
FIG. 3 is a view similar to FIG. 2, illustrating the power semiconductor device after assembled with the bus bars and the radiating fin.
Figure 4:
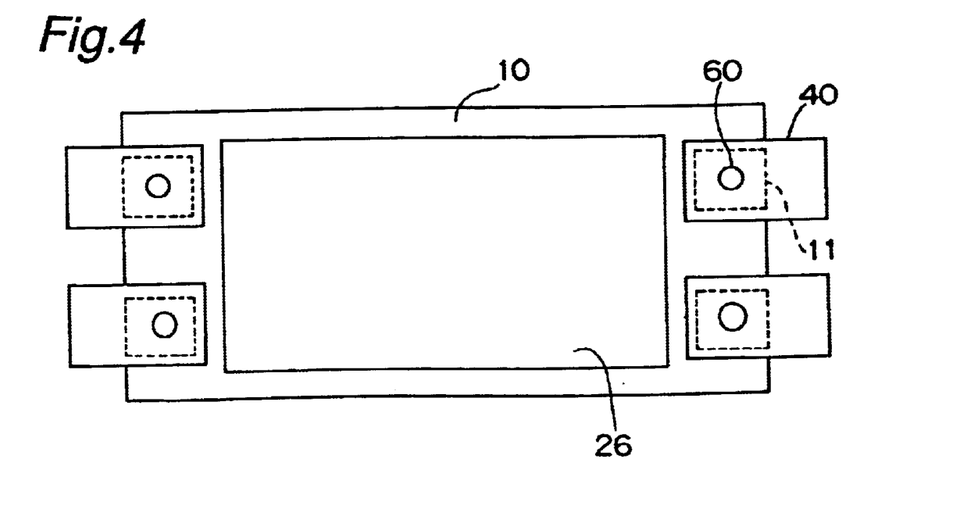
FIG. 4 is a top view of the power semiconductor device after assembled with the bus bars and the radiating fin.

Next, referring to FIGS. 2 and 3, a process for assembly of the power semiconductor device 1 so constructed to a peripheral device will be described hereinafter. A plurality of bus bars 40 are provided, each of which is an external conducting plate (also referred to as "conducting member"). Each of the bus bars 40 also has a bus-bar through-hole 42 extending in the vertical direction and is arranged on the corresponding main terminals 11 so that the bus-bar through-hole 42 is aligned with the through-hole 2 of the power semiconductor device 1 of the present invention. On the other hand, a radiating fin 50 includes a contacting surface 51 for contacting with a bottom surface 31 of the base plate 30. The radiating fin 50 also has a plurality of receiving members 52 such as threaded nuts, which are embedded at portions corresponding to the through-holes 2 of the power semiconductor device 1. The radiating fin 50 is positioned beneath the power semiconductor device 1. Each of the through-holes 42 of the bus bars 40 and the receiving members 52 of the radiating fin 50 are all aligned to the corresponding through-hole 2 of the power semiconductor device 1. Then, a plurality of elongate fastening screws 60 made of insulating material are inserted in the through-holes 2 and 42 and in the receiving members 52 so as to connect the bus bars 40 with the housing 10 and as well as to secure the base plate 30 to the radiating fin 50.

The radiating fin 50 is secured to the base plate 30 for efficiently radiating heat generated by the semiconductor chip 20 outside of the power semiconductor device 1, thus, it should be in close contact with the base plate 30 with an area as wide as possible. Preferably, provided between the bottom surface 31 of the base plate 30 and the contacting surface 51 of the radiating fin 50 is a grease of a good thermal conductivity (not shown) having a thickness between approximately 100 microns through 200 microns.

It should be noted that, in the present embodiment, the elongate fastening screw 60 is made of insulating material so that electrical connection between the main terminal 10 and the radiating fin 50 is prevented. Such insulating material includes, for example, engineering plastics and ceramics.

As described above, the power semiconductor device 1 can be secured with the bus bar 40 and the radiating fin 50 by means of the single insulating screw 60 at a time. Thus, when the power semiconductor device 1 has two pairs of main terminals 11 as indicated in FIG. 1, four of the insulating screws 60 are used for assembly with the peripheral device. Therefore, comparing to the power semiconductor device according to the prior art, the number of screws to be secured are reduced in half, and the assembling task is substantially relieved. Also, in addition, the present invention eliminates the undesirable dead spaces, which would otherwise be defined at the corners over the through-holes of the base plate of the conventional power semiconductor device. Thus, a more compact power semiconductor device 1 can be realized according to the present invention.

Figure 5:
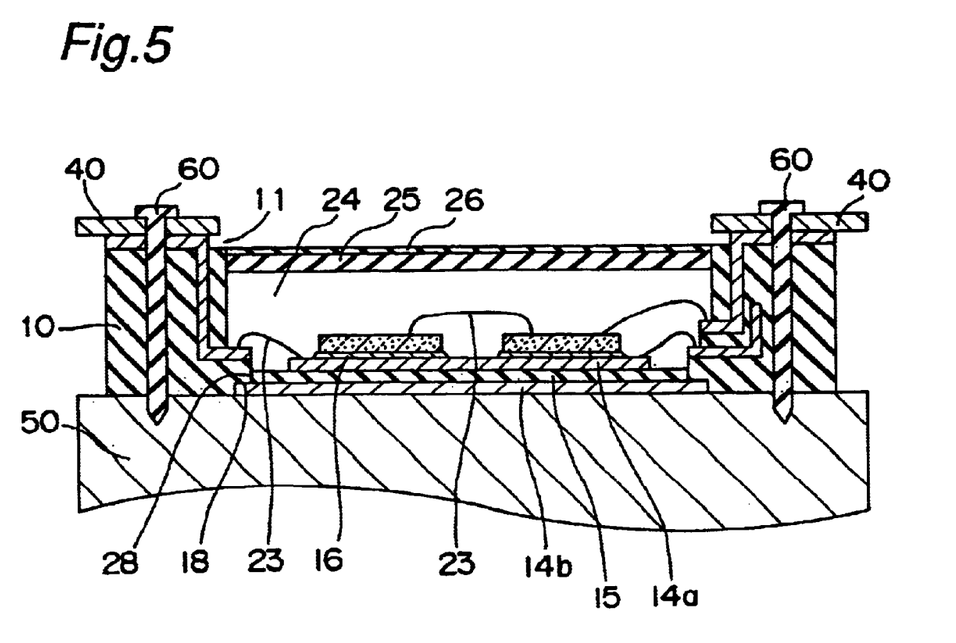
FIG. 5 is a schematic perspective view similar to FIG. 2, illustrating a power semiconductor device according to Embodiment 2 of the present invention.

Next, referring to FIG. 5, a power semiconductor device according to Embodiment 2 of the present invention will be described hereinafter. The power semiconductor device 1 illustrated in FIG. 5 has a structure similar to that of Embodiment 1 except that it has no base plate, thus, description thereof will be provided herein focusing on the distinguishable features of Embodiment 2.

According to Embodiment 2, the insulating substrate 15 also has patterned metal layers 14a, 14b formed on both sides thereof, as well as that of Embodiment 1. However, the lower metal layer 14b of Embodiment 2 is constructed to have an area wider than that of the insulating substrate 15 so that a stepped portion 18 is defined around the insulating substrate 15. Meanwhile, the housing 10 of Embodiment 2 has an abutment portion 28 designed to have a size and configuration corresponding to the stepped portion 18. Also, as above, in the power semiconductor device 1 of Embodiment 2, the base plate 30 is eliminated, thus, the insulating substrate 15 is secured directly on the housing 10 by bonding the stepped portion 18 with the abutment portion 28 with use of an appropriate adhesive (not shown).

The power semiconductor device 1 so constructed has no base plate so that it can be designed thinner than that of Embodiment 1. Thus, the power semiconductor device 1 of Embodiment 2 can be even more compact in a thickness direction.

Modification 1

Figure 6:
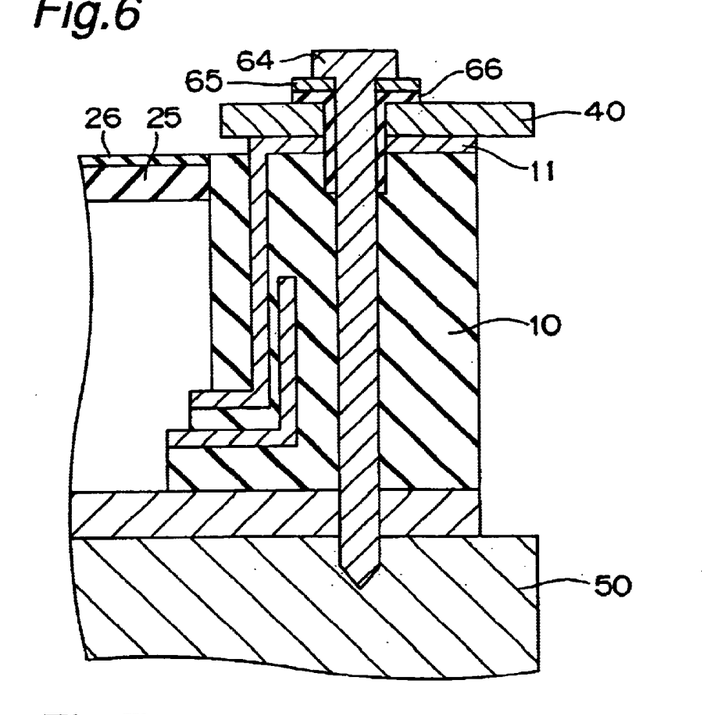
FIG. 6 is an enlarged cross sectional view of power semiconductor device according to Modification 1 of the present invention, illustrating the metal screws and the insulating spacer.

With reference to FIG. 6, Modification 1 of Embodiment 1 will be described hereinafter, in which a fastening screw 64 made of metal and an insulating bush 65 made of insulating material are substituted for the fastening screw 60 made of insulating material of Embodiment 1. As described above, the fastening screw can be of any form if electrical connection between the main terminal 11 and the radiating fin 50 is isolated. In FIG. 6, the fastening screw 64 is made of metal, and provided between the fastening screw 64 and the bus bar 40 are a washer 65 and an insulating bush 66 made of insulating material such as engineering plastics, ceramics, and rubber. The insulating bush 66 extends downwardly beyond the main terminal 11. Thus, the insulating bush 66 electrically isolate the metal fastening screw 64 from the main terminal 11 and the bus bar 40 so that electrical connection between the main terminal 11 and the radiating fin 50 is avoided. As a person skilled in the art can easily conceive, Modifications 1 can be applied to both Embodiments 1 and 2.

Modification 2

Figure 7:
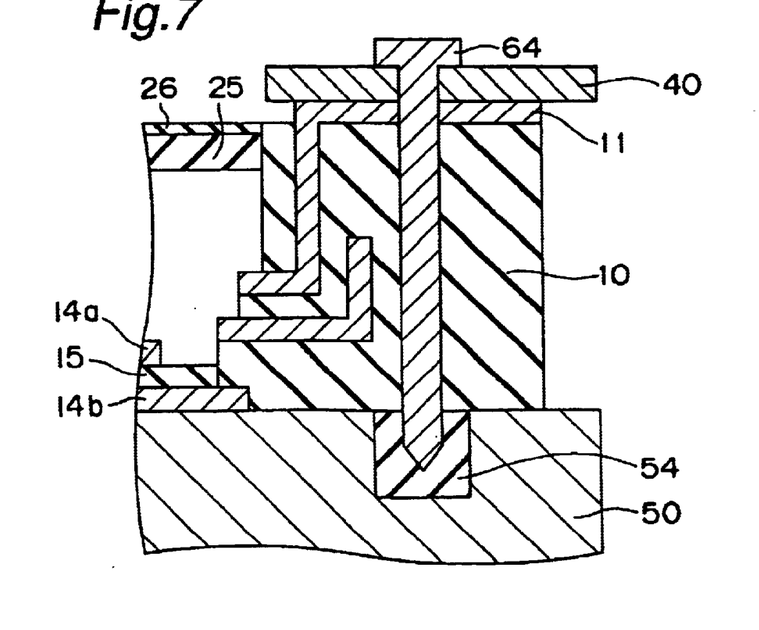
FIG. 7 is an enlarged cross sectional view of power semiconductor device according to Modification 2 of the present invention, illustrating the metal screws and the insulating receiving member.

With reference to FIG. 7, Modification 2 of Embodiment 2 will be described hereinafter, in which a metal fastening screw and an insulating receiving member made of insulating material are substituted for the insulating screw 60 of Embodiment 2. In FIG. 7, the screw 64 is made of metal, and the receiving member 54 such as a nut is made of insulating material including engineering plastics, ceramics, and rubber. The insulating nut 54 is embedded within the radiating fin 50 and bonded therein by means of appropriate adhesive (not shown). Thus, the insulating nut 66 electrically isolate the metal fastening screw 64 from the radiating fin 50 so that electrical connection between the main terminal 11 and the radiating fin 50 is avoided.

Also, Modifications 2 can basically be applied to both Embodiments 1 and 2. However, when applied to Embodiment 1, the base-plate through-holes 2c of the base plate 30 should be designed to have a diameter sufficiently greater than that of the metal fastening screw 64 so that connection between the metal screw 64 and the base plate 30 is avoided.

What is claimed is:

1. A semiconductor device, comprising:

a housing having top and bottom surfaces;

an insulating substrate with metal layers formed on upper and lower surfaces thereof, the insulating substrate surrounded within the housing;

a semiconductor chip mounted on a first one of the metal layers of the insulating substrate; and a terminal connector extending along the top surface of the housing and being bent towards the bottom surface thereof for supplying the semiconductor chip with power;

wherein the housing has a housing through-hole extending from the top surface to the bottom surface through the housing, and wherein said terminal connector has a terminal connector through-hole which is aligned with and formed coaxially with the housing through-hole.

2. The semiconductor device according to claim 1, further comprising:

a supporting metal plate fixed on a second one of the metal layers of the insulating substrate; and wherein the supporting metal plate has a supporting metal plate through-hole which is aligned with and formed coaxially with the housing through-hole.

3. The semiconductor device according to claim 2, wherein a bottom surface of the second one of the metal layers of the insulating substrate is secured directly to a top surface of the supporting metal plate.

4. The semiconductor device according to claim 1, further comprising:

a conducting member connected with the terminal connector, having a conducting member through-hole which is aligned with and formed coaxially with the housing through-hole;

a metal fastening member inserted through the conducting member through-hole, the terminal connector through-hole, and the housing through-hole; and an insulating spacer for electrically isolating the metal fastening member from the conducting member.

5. The semiconductor device according to claim 1, further comprising:

a conducting member connected with the terminal connector, having a conducting member through-hole which is aligned with and formed coaxially with the housing through-hole;

a metal fastening member inserted through the conductor through-hole, the terminal connector through-hole, and the housing through-hole;

a receiving member made of insulating material for receiving the metal fastening member; and a radiator made of metal embedding the receiving member made of insulating material therein for receiving the metal fastening member.

6. The semiconductor device according to claim 2, further comprising:
   a conducting member connected with the terminal connector, having a conducting member through-hole which is aligned with and formed coaxially with the housing through-hole; and
   a fastening member made of insulating material and inserted through the conducting member through-hole, the terminal connector through-hole, and the housing through-hole.

* * * * *